(12) United States Patent
Posseme et al.

(10) Patent No.: US 9,337,350 B2
(45) Date of Patent: May 10, 2016

(54) TRANSISTOR WITH REDUCED PARASITIC CAPACITANCE AND ACCESS RESISTANCE OF THE SOURCE AND DRAIN, AND METHOD OF FABRICATION OF THE SAME

(71) Applicant: COMMISSARIAT A L'ENERGIE ATOMIQUE ET AUX ENE ALT, Paris (FR)

(72) Inventors: Nicolas Posseme, Carantec (FR); Laurent Grenouillet, Rives (FR); Yannick Le Tiec, Crolles (FR); Maud Vinet, Rives (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 13/727,104

(22) Filed: Dec. 26, 2012

(65) Prior Publication Data

US 2013/0161746 A1    Jun. 27, 2013

(30) Foreign Application Priority Data

Dec. 27, 2011  (FR) .................................... 11 62481

(51) Int. Cl.
*H01L 29/786* (2006.01)
*H01L 29/66* (2006.01)
*H01L 29/78* (2006.01)

(52) U.S. Cl.
CPC .... *H01L 29/78696* (2013.01); *H01L 29/66477* (2013.01); *H01L 29/66636* (2013.01); *H01L 29/66772* (2013.01); *H01L 29/7848* (2013.01)

(58) Field of Classification Search
CPC ............ H01L 21/84; H01L 21/823814; H01L 27/1203; H01L 29/66628; H01L 29/66636; H01L 29/66477; H01L 29/66772; H01L 29/7848; H01L 21/7624; H01L 21/76264; H01L 29/78696
USPC ................................... 257/288, 347; 438/300
See application file for complete search history.

(56) References Cited

U.S. PATENT DOCUMENTS

| 6,534,831 | B2 * | 3/2003 | Kato ................. H01L 29/78639 257/347 |
| 6,583,026 | B1 * | 6/2003 | Allman et al. ................. 438/424 |
| 6,602,779 | B1 | 8/2003 | Li et al. |
| 7,154,151 | B2 * | 12/2006 | Minami .............. H01L 27/0255 257/355 |
| 7,741,164 | B2 * | 6/2010 | Pelella ............ H01L 21/823481 257/357 |
| 2002/0022328 | A1 * | 2/2002 | Ang ........................ H01L 21/84 438/303 |
| 2002/0034841 | A1 * | 3/2002 | Lee .............................. 438/149 |
| 2004/0188760 | A1 * | 9/2004 | Skotnicki et al. ............. 257/347 |

(Continued)

OTHER PUBLICATIONS

European Search Report issued Mar. 22, 2013 in Patent Application No. 12198475.1 (with English translation of category of cited documents).

(Continued)

*Primary Examiner* — Khiem D Nguyen
*Assistant Examiner* — Pauline Vu
(74) *Attorney, Agent, or Firm* — Oblon, McClelland, Maier & Neustadt, L.L.P.

(57) ABSTRACT

A transistor includes an active layer forming a channel for the transistor, an insulating layer disposed facing a lower face of the active layer, a gate turned toward an upper face of the active layer and a source and a drain disposed on both sides of the gate. At least one among the source and the drain extends at least partly through the active layer and into the insulating layer.

15 Claims, 7 Drawing Sheets

(56) References Cited

U.S. PATENT DOCUMENTS

| | | | |
|---|---|---|---|
| 2005/0045949 A1 | 3/2005 | Lin et al. | |
| 2005/0112811 A1* | 5/2005 | Hsu et al. | 438/197 |
| 2005/0158923 A1 | 7/2005 | Lin et al. | |
| 2006/0084235 A1* | 4/2006 | Barr et al. | 438/300 |
| 2006/0131648 A1 | 6/2006 | Ahn et al. | |
| 2006/0220113 A1* | 10/2006 | Tamura | H01L 21/743 257/335 |
| 2007/0057324 A1* | 3/2007 | Tews et al. | 257/347 |
| 2007/0096148 A1* | 5/2007 | Hoentschel et al. | 257/192 |
| 2007/0117334 A1* | 5/2007 | Nayfeh et al. | 438/301 |
| 2008/0169490 A1* | 7/2008 | Kawai | 257/288 |
| 2008/0305613 A1* | 12/2008 | Pelella | H01L 21/76275 438/433 |
| 2009/0310431 A1* | 12/2009 | Saito | 365/207 |
| 2010/0001340 A1* | 1/2010 | Lee et al. | 257/334 |
| 2010/0109046 A1* | 5/2010 | Mehandru et al. | 257/190 |
| 2010/0155790 A1* | 6/2010 | Lin et al. | 257/288 |
| 2011/0024840 A1 | 2/2011 | Khater | |
| 2011/0241073 A1 | 10/2011 | Cohen et al. | |
| 2012/0025266 A1* | 2/2012 | Griebenow et al. | 257/190 |

OTHER PUBLICATIONS

French Preliminary Search Report and Written Opinion issued Jun. 18, 2012 in corresponding French Application No. 11 62481 filed on Dec. 27, 2011 (with an English Translation of Categories).

K. Cheng et al., "Fully Depleted Extremely Thin SOI Technology Fabricated by a Novel Integration Scheme Featuring Implant-Free, Zero-Silicon-Loss, and Faceted Raised Source/Drain", 2009 Symposium on VLSI Technology, Jun. 16-18, 2009, 1 Page.

* cited by examiner

Prior Art

TRANSISTOR WITH REDUCED PARASITIC CAPACITANCE AND ACCESS RESISTANCE OF THE SOURCE AND DRAIN, AND METHOD OF FABRICATION OF THE SAME

TECHNICAL FIELD OF THE INVENTION

The present invention relates in general to the transistors of metal oxide semiconductor type with field effects (MOSFET) and more particularly to the reduction of parasitic factors that limit their operating speed.

PRIOR ART

The steadily growing integration of an increasingly large number of elementary components in the integrated circuits produced by the microelectronics industry is leading to the need for continuous reduction of their size. The typical basic component of a very large number of integrated circuits is a transistor of metal oxide semiconductor structure or MOS, of field-effect type or FET, the English acronym for "field effect transistor". In a MOSFET transistor, a current is made to circulate between a "source" electrode and a "drain" electrode under the control of a control "gate", which creates a conduction channel between source and drain as soon as a sufficient voltage is applied to it. The maximum switching rate of a MOSFET transistor depends on the speed with which the conduction current can be effectively established and made to disappear. Among other factors, it depends on numerous physical parameters specific to the materials used, for example the mobility of carriers of the semiconductor material employed and the levels and type of doping of the different zones defining the electrodes. The switching rate also depends largely on the geometry and structure of the transistors. In particular, by the presence of parasitic factors that are inevitably introduced by the practical manufacture of these devices. Two particularly critical parasitic factors are on the one hand the series access resistance of the source and drain electrodes and on the other hand the parasitic capacitance between gate and source or drain. These parasitic factors form a time constant that contributes to limiting the maximum switching rate of every transistor.

FIG. 1 shows a cross-sectional view of a MOSFET transistor 100 characteristic of the current state of the art. Most often the integrated circuits are currently manufactured from prepared substrates of the type known as SOI, the English acronym for "silicon on insulator", in other words "silicon on insulation" and more generally "semiconductor on insulation". FIG. 1 shows the starting SOI substrate 110, which is constituted of an initial substrate 112, most often a homogeneous silicon wafer, and of a buried oxide layer 114, which assures insulation of components that will be fabricated in the thin surface layer 116 of semiconductor present on the buried layer. Surface layer 116 is most often constituted of monocrystalline silicon. The insulation of each of transistors 100 is supplemented by the formation of lateral insulation trenches known as STI, the English acronym for "shallow trench isolation", in other words "insulating trenches of small depth". They extend to the buried oxide layer to enclose each of the transistors in a continuous oxide layer. These trenches, which are not necessary to the understanding of the invention, are not represented.

FIG. 2 summarizes the main standard steps of fabrication of a MOSFET transistor representative of the prior art. The steps described briefly hereinafter employ methods and means that have been constantly developed and improved for decades by the microelectronics industry, and especially photolithography for defining patterns. First step 210 consists in producing, from starting SOI substrate 110, the aforesaid insulating trenches STI, which will make it possible to assure complete insulation of each of the transistors 100. In the following global step 220, layers and patterns are stacked to constitute gate 120 of each transistor, which gate comprises two main layers: thin gate oxide 122 and control gate 124 proper. The latter is generally made of conductive polycrystalline silicon, which functions as the metal in the MOS structure of the transistor, or of a stack of layers constituted of a metal and of polysilicon. In the following step 230, a first layer of spacers 130 is formed on the sidewalls of each gate pattern. The spacers, made of silicon nitride, and the gate itself, will function to protect channel 180 during a subsequent first operation of implantation of the surface layer of silicon. It will be noted here that the spacers and the sources and drains are formed without employing any photolithography operation. As mentioned hereinabove, a first implantation 240 of zones of source and drain 140 in surface layer 116, generally made of monocrystalline silicon, is then carried out. It will be noted that source and drain are identical, they have the same physical and geometric structure. Only their interconnections with other transistors and the voltages that will be applied in the electronic device in the course of production will ultimately make it possible to allocate the function of source or drain to one or the other of the electrodes. In the description hereinafter of the invention, the source and drain electrodes are therefore not differentiated and are denoted by the same acronym, "S/D" 140.

The ensuing step 250 of the standard method for production of a transistor in conformity with FIG. 1 consists in increasing the thickness 142 of the source and drain (S/D) zones. The main objective of this operation is to reduce the access resistances 145 of these electrodes. The thickening of S/D zones is traditionally achieved by epitaxial growth starting from the underlying layer, in other words layer 116 of monocrystalline silicon of the starting SOI substrate. It therefore involves decreasing one of the parasitic factors mentioned in the foregoing, which factors limit the switching rate and the performances of the transistors. Because it is known that the access resistance is inversely proportional to the thickness of the S/Ds, it will be noted here that increased raising of the S/Ds is of great interest for significantly reducing this parasitic factor. This type of transistor and method is often referred to as "RSD", the English acronym for "raised source drain", in other words "elevated source drain".

The other standard operations consist in a step 260 of producing a second layer of spacers 150. This second layer of spacers functions to limit the silicidation zones laterally around the gate pattern, thus making it possible to assure good electrical contact with the silicon of raised S/Ds 140. Silicidation 160 and metal contacts 170 are formed in step 280. Prior to this, a second implantation of the S/Ds is performed in step 270 which assures doping of these zones. As for the S/Ds, it will be noted that silicidation of the high part of gate 120 made of polycrystalline silicon is also achieved in order to establish good electrical contact on this electrode. For clarity, however, the gate contact and its silicidated zone are not represented in FIG. 1.

The other parasitic factor mentioned in the foregoing is the capacitance 190 between the S/Ds and the gate. The spacers constitute the dielectric of this capacitance. The parasitic capacitance due to the spacers tends to increase in proportion to the growth of thickness 142 of the raised epitaxial layer of S/Ds 140. In this way it is observed that, in the standard method for production of MOSFET transistors that has just been briefly described, the conditions of optimization of the main parasitic factors that limit their switching speed are perfectly opposed, since to decrease one, the access resistance of source and drain 140, it is necessary to increase the raising thereof, thus leading to an increase of the other parasitic factor, in other words the capacitance 190 between the gate and the source and drain 140.

Different techniques have been proposed to compensate for the increase of parasitic capacitance between the gate and the S/Ds 140. A first method consists in using spacers wherein the material has lower permittivity than that of the silicon nitride currently used. For example, replacement of the nitride by silicon oxide makes it possible to reduce the value of the parasitic capacitance significantly.

However, the replacement of the nitride seriously complicates the standard method of fabrication of MOSFET transistors. This replacement may be achieved by providing for supplementary steps, in the course of which the nitride that normally provided protection is finally stripped, in order to permit self-alignment of the S/Ds on the gate, as explained in the foregoing. The nitride is then replaced in the final device by silicon oxide, with the advantage of a decrease of parasitic capacitance 190. This solution therefore has the drawback of adding additional and delicate steps to the standard method.

The standard method may also be modified by providing for the direct use of silicon oxide spacers. However, this material is much less suitable than the nitride for forming spacers, and at present an industrially reliable method permitting direct replacement of the nitride does not exist.

Another method that has also been tried experimentally is that in which the epitaxial growth that permits raised S/Ds to be obtained in order to decrease the access resistance of these electrodes is achieved by limiting the lateral growth of this epitaxy in order to increase the distance of the S/D zones 140 from the gate and therefore to decrease the parasitic capacitance 190 by increasing the thickness of dielectric between these zones. However, this technique, known as "faceted epitaxy", is particularly difficult to control. The thickness of silicon deposited during the growth of faceted epitaxy is very sensitive to the environment. Thus there are disparities of thickness between broad and narrow devices that may induce dysfunctioning such as total silicidation and development of leakage currents that seriously harm the reliability of the devices. Disparities of thickness are also observed between the zones in which the density of patterns is great and those in which it is slight.

From this brief presentation of known methods for manufacture of MOSFET transistors, it is therefore clearly apparent that no known solution makes it possible to reduce both the access resistance of the source and drain electrodes and at the same time the parasitic capacitance between these electrodes and the control gate, and of doing so while proposing a relatively simple and reliable fabrication method.

The objective of the present invention is to propose a solution that addresses at least some of these constraints.

The other objects, characteristics and advantages of the present invention will become apparent upon examination of the description hereinafter and of the accompanying drawings. It is understood that other advantages may be incorporated.

SUMMARY OF THE INVENTION

One object of the present invention relates to a transistor comprising at least: an active layer forming a channel for the transistor, an insulating layer disposed facing a lower face of the active layer, a gate turned toward an upper face of the active layer and a source and a drain disposed on both sides of the gate. At least one among the source and the drain extends at least partly through the active layer and into the insulating layer. At least part of the drain and/or of the source is therefore buried in the insulating layer and extends underneath the lower face of the active layer.

Optionally but nevertheless advantageously, the source and the drain both pass through the active layer and extend into the insulating layer. Thus the transistor has a very particular structure in which the source and/or the drain are inverted relative to the known structures, in other words they are buried in the insulating layer underlying the channel. This structure makes it possible to reduce the parasitic capacitance between the gate and the source and drain. In addition, it makes it possible to thicken the source and the drain in a direction perpendicular to the plane of the substrate, with the effect of reducing the access resistance of the electrodes of the source and of the drain.

Likewise advantageously, the invention makes it possible to make the height of the gate independent relative to the height of the source and drain, thus making it possible in particular to reduce the height of the gate.

Optionally, the transistor according to the invention may additionally comprise at least one of any of the characteristics mentioned below:

Advantageously, the source and the drain extend into the insulating layer from the upper face of the active layer.

Preferably, at least one among the source and the drain that passes through the active layer and extends into the insulating layer from the upper face of the active layer has a thickness of between 3 and 50 nm (nanometers), the thickness being taken in a direction perpendicular to the plane of the substrate.

Preferably, the gate and the at least one among the source and the drain are disposed on opposite sides of the upper face of the active layer.

Advantageously, the at least one among the source and the drain has an upper face situated underneath a lower face of the gate. As will be explained hereinafter and illustrated in the figures, the upper face of the source and/or of the drain is entirely situated underneath a lower face of the gate. Thus, in a direction parallel to the plane of the substrate, the source and the drain are not facing the gate. Advantageously, neither the source nor the drain has surface area facing the gate in a direction parallel to the plane of the substrate. That makes it possible to limit the surface areas of the source and/or of the drain facing the gate, thus advantageously leading to a reduction of the parasitic capacitance.

Advantageously, at least one among the source and the drain has a height smaller than the thickness of the insulating layer, the height being counted from the lower face of the active layer or of the channel. The height and thickness of the active layer are taken in a direction substantially perpendicular to the plane of the substrate. Preferably, one among the source and the drain has a height smaller than the thickness of the insulating layer less two nanometers. Preferably, both the source and the drain have a height smaller than the thickness of the insulating layer less two nanometers.

Thus at least one among the source and the drain has a height smaller than the thickness of the insulating layer. Thus the S/Ds do not pass completely through the insulating layer. In this way the invention makes it possible to preserve electrical insulation between the S/Ds and the substrate.

Typically, the thickness of an insulating layer of buried oxide layer type, often referred to by the acronym BOX, meaning buried oxide, is 25 nm, the thickness of the source and/or of the drain then being smaller than 23 nm. Preferably, the height of the source and/or of the drain is between 1 nm and the thickness of the insulating layer less two nanometers.

Preferably, the at least one among the source and the drain extending underneath the lower layer of the active layer does not extend into the substrate.

Preferably, the at least one among the source and the drain passing through the active layer and extending into the insulating layer has a portion facing the gate in a direction parallel to the plane of the substrate, the height of the said portion in a direction perpendicular to the plane of the substrate being smaller than 0.3 times the height of the gate.

Preferably, this height is smaller than 0.1 times the height of the gate.

According to this alternative, the source and/or the drain has a facing portion, but the dimension of this portion compared with the gate is very limited, thus reducing the parasitic capacitance compared with the known solutions.

Preferably, at least one among the source and the drain has a height of between 0.2 and 1 times the height of the gate. The height is taken in a direction substantially perpendicular to the plane of the substrate (or plane of any other layer). Preferably, the width of the at least one among the source and the drain at the insulating layer is between 1.2 and 5 times the width at the active layer and preferably between 1.5 and 5 times the width at the active layer. More generally, at least one among the source and the drain has, in directions substantially parallel to the plane of the substrate, a smaller width at the active layer than the width at the insulating layer, Preferably, the transistor comprises a protective layer covering the active layer and the gate, with the exception of zones of electrical contact.

Preferably, the transistor is of MOSFET type comprising a single gate. The insulating layer is a buried oxide layer and the active layer is a layer of monocrystalline silicon.

According to an advantageous embodiment, the insulating layer is disposed in contact with the lower face of the active layer. Preferably, the protective layer is disposed on the upper face of the active layer and preferably directly in contact therewith. In this way it covers the active layer. In one embodiment with a protective layer formed after production of sources and drains, the protective layer is preferably in contact either with the active layer or in contact with a stop layer, the latter then being in contact with the upper face of the active layer. Preferably, the gate oxide layer is disposed in contact with the active layer.

Another object of the present invention relates to a microelectronic device comprising a plurality of transistors according to the invention. By microelectronic device there is understood any type of device produced with means of microelectronics. These devices include in particular, in addition to devices with purely electronic purpose, micromechanical or electromechanical devices (MEMS, NEMS . . . ) as well as optical or optoelectronic devices (MOEMS . . . ).

Another object of the present invention relates to a method of fabrication of a transistor, comprising the preparation of a stack of layers provided with at least one support substrate overlaid by an insulating layer and by an active layer intended to form a channel for the transistor, the active layer being intended to be overlaid by a control gate of the transistor, the method additionally comprising the preparation of a source and of a drain disposed on both sides of the gate, the method being characterized in that the preparation of the source and of the drain comprises: the deposition of a protective layer covering at least the active layer; the formation of openings through the protective layer and the active layer to lay bare the insulating layer at the zones intended to form the source and the drain; the formation of a cavity in the insulating layer at the bottom of the openings; the filling of the cavities by a semiconductor material to form at least in part at least one among the source and the drain of the transistor.

This method therefore makes it possible to form inverted and thick source and drain, thus reducing the parasitic resistances and capacitances. Advantageously, this method is relatively simple to employ. In addition, it exhibits good reliability and good reproducibility.

Optionally but particularly advantageously, the protective layer is preserved during filling of the cavities.

Optionally, the method according to the invention may additionally comprise at least any one of the characteristics and steps mentioned below:

Preferably, the step of formation of a cavity in the insulating layer is performed so as to form a cavity wherein the depth in a direction perpendicular to the plane of the substrate and taken from the lower face of the insulating layer overlaid by the active layer is between 1 nm and Tbox-2 nm, where Tbox is the thickness of the insulating layer. Preferably, the part of the source and drain that extends isotropically underneath the spacers is not broader than the spacers.

Preferably, the width of the cavity is substantially equal to the height of the cavity taken from a lower face of the active layer.

Preferably, the cavities do not extend beyond the spacers, in other words the cavities are not present in the vertical extension of the spacers. Thus the cavities are distant from the spacers and the sidewalls of the gate in a direction perpendicular to the sidewalls of the gate. Otherwise expressed, the cavities are formed in such a way that the lateral extremities of the cavity are distant from the vertical extension of the sidewalls of the gate.

Preferably, filling is performed in such a way that the cavity is filled completely. Thus the material forming the S/Ds is in contact with the insulating layer in a direction perpendicular to the sidewalls of the gate.

Preferably, the active layer is made of a semiconductor material and the filling of the cavities is achieved by epitaxy of the active layer. The active layer is made of monocrystalline silicon.

Advantageously, in the course of formation of the openings, there are made an opening directly above a zone intended to form the source and an opening directly above a zone intended to form the drain.

Preferably, silicidation of contacts is performed at the source and the drain.

According to one embodiment, the protective layer is preserved in the course of all of the steps of the method. According to another embodiment, the method additionally comprises, after the step of filling of the cavities by a semiconductor material: removal of the protective layer; deposition of at least one electrically insulating layer over the entire stack of layers; opening of contact zones at least at the source and the drain.

Preferably, the method additionally comprising a step of silicidation of the contact zones.

According to one embodiment, the doping of the source and of the drain is achieved in situ during the filling of the cavities. According to another embodiment, the doping of the source and of the drain is performed by means of ion implantation after the step of filling of the cavities.

Preferably, the source and the drain are subjected to diffusion annealing.

Preferably, the stack of layers comprising the substrate, the insulating layer and the active layer is a substrate of semiconductor on insulator type (SOI). The SOI substrate comprises a surface active layer of monocrystalline silicon on a buried silicon oxide layer having a thickness compatible with the size of the cavities excavated to form the inverted source and drain therein.

Preferably, the material constituting the protective layer is carbon-doped silicon oxide (SiOCH) or is amorphous carbon (APF). More generally, the protective layer is made of a material resistant to the product of etching of the cavities.

According to one embodiment, the preparation of the source and of the drain is performed after a step of formation of a control gate of the transistor, the gate overlying the active layer. According to an alternative embodiment, the preparation of the source and of the drain is performed before a step of formation of a control gate of the transistor, the gate overlying the active layer. In this way the gate does not have to be subjected to stresses, thermal in particular, during the different steps of fabrication of the other elements of the transistor, and in this way the heat budget of the gate is preserved.

BRIEF DESCRIPTION OF THE FIGURES

The objectives, objects, as well as the characteristics and advantages of the invention will become more clearly apparent from the detailed description of an embodiment thereof which is illustrated by the following accompanying drawings, wherein.

The attached drawings are provided by way of examples and are not limitative of the invention.

DETAILED DESCRIPTION OF THE INVENTION

Figure 3A:
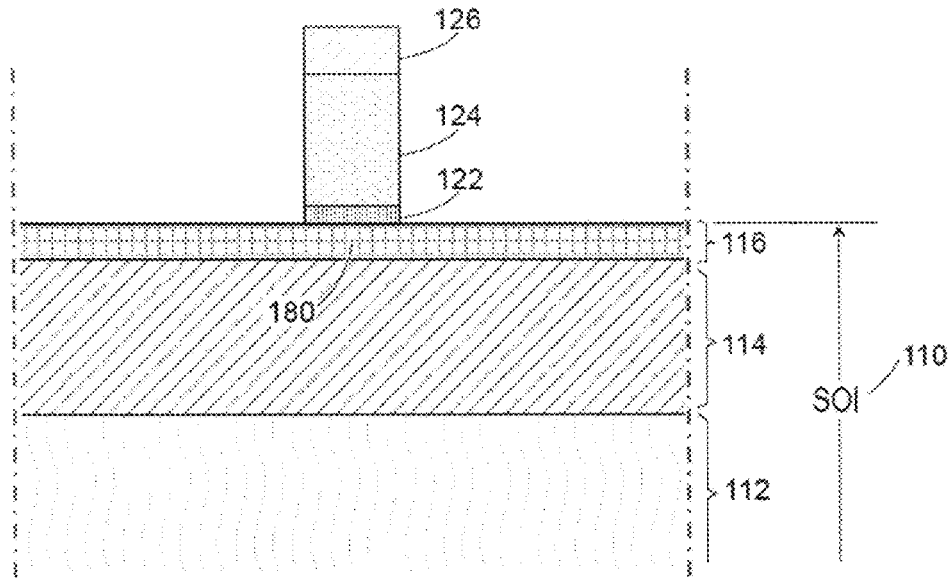
FIGS. 3a to 3c illustrate the steps of the method of the invention that are identical to those of the standard method of fabrication of MOSFET transistors.
Figure 3B:
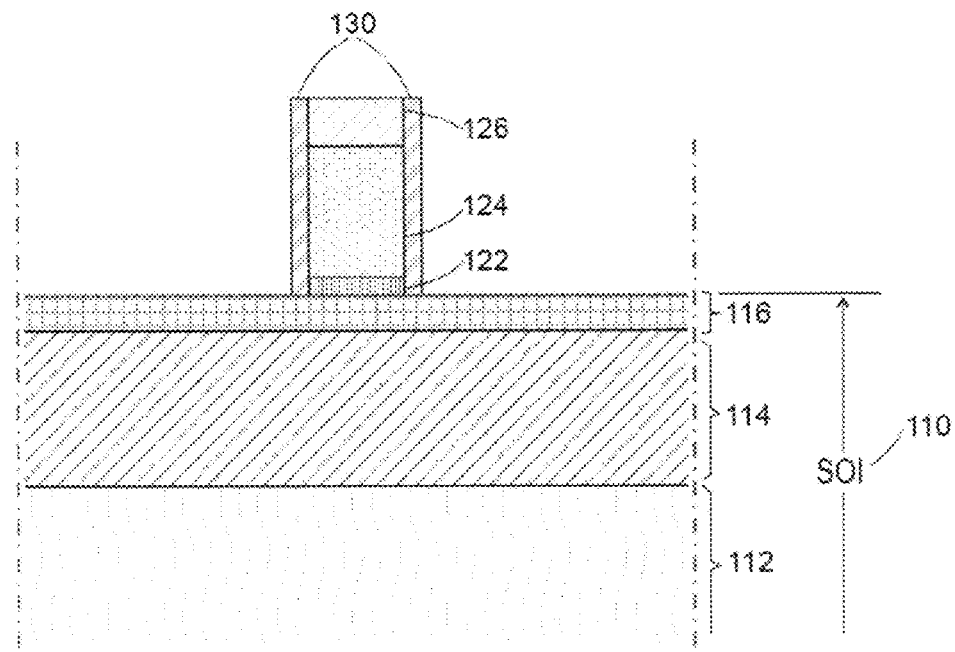
Figure 3C:
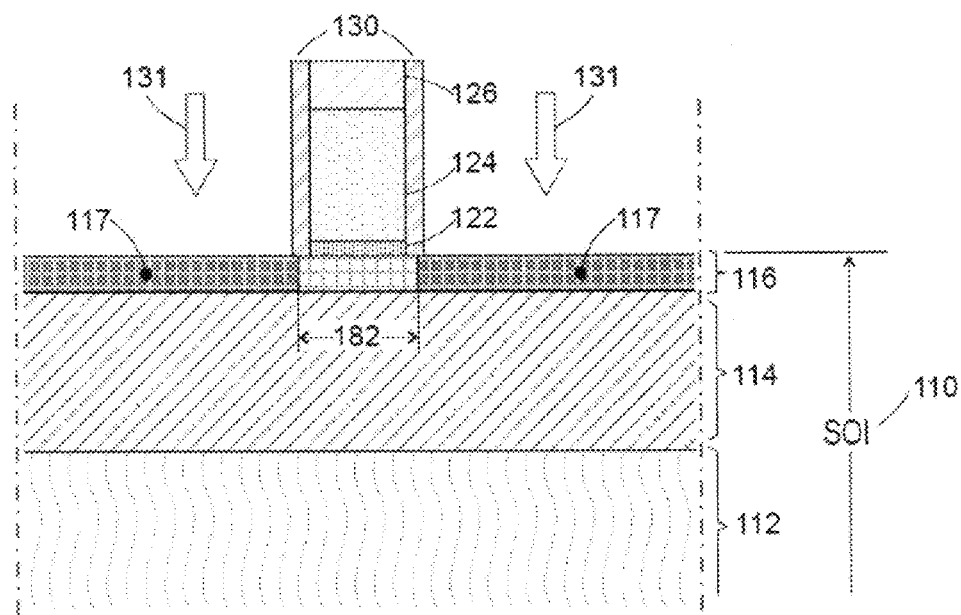

FIGS. 3a to 3c describe the steps of the method of the invention. These steps are substantially identical to those of the standard method of fabrication of a MOSFET transistor representative of the prior art, such as that in FIG. 1. FIGS. 3a, 3b and 3c correspond respectively to steps 220, 230 and 240, which have already been briefly described in the section about the prior art. As already mentioned, they are preceded by a standard step 210 of formation of insulating trenches (STI), which is not necessary for understanding of the invention and which is not described.

It is clarified that, within the scope of the present invention, the terms "on", "overlying" or "underlying" do not necessarily means "in contact with". Thus, for example, the deposition of a first layer on a second layer does not necessarily mean that the two layers are directly in contact with one another but means that the first layer covers the second layer at least partly, either by being directly in contact therewith or by being separated therefrom by another layer or another element.

FIG. 3a shows the gate structure at the end of step 220. Gate oxide layer 122 and gate 124, also referred to as control gate 124, again appear therein. Gate 124 is preferably made of conductive polycrystalline silicon. By applying a voltage greater than a threshold to this gate 124, it is possible to create a conduction channel 180 within the transistor once it is finished, in the part of underlying active layer 116, active layer 116 being preferably but not limitatively made of monocrystalline silicon. To this end, thin gate oxide layer 122 is made of a dielectric material having preferably but not limitatively a high relative permittivity, also referred to as dielectric coefficient.

According to an advantageous embodiment, active layer 116, in which a conduction channel 180 is created electrically underneath each gate, originates from a substrate of silicon-on-insulator (SOI) type, from which the device being manufactured is obtained in the course of fabrication. Depending on the embodiments, it is possible that active layer 116 will have been doped beforehand, generally by ion implantation, to permit the fabrication of N-channel or P-channel transistors and to regulate the electrical conduction threshold mentioned hereinabove.

The SOI substrate comprises a buried oxide layer 114 on a homogeneous substrate 112, generally a silicon wafer of sufficient thickness to be mechanically rigid and thus form an easily manipulable assembly. In the gate structure of FIG. 3a, it is noted that an upper layer 126 is present at this stage, which layer will function as a hard mask for protection of the gate during operations to follow. Typically, the gate layers are obtained by vapor-phase deposition in a confined cell of PVD or CVD type, the English acronyms for "physical vapor deposition" and "chemical vapor deposition", in other words respectively physical or chemical deposition in the vapor phase. The gate patterns and dimensions are defined in standard manner by photolithography.

FIG. 3b shows the gate structure at the end of step 230 of formation of first spacers 130. The spacers are obtained in standard manner by a conforming deposit of a layer of silicon nitride. By conforming deposit there is understood a deposit whose thickness is substantially independent of the inclination of the surfaces on which it is applied. In particular, for the formation of spacers, the thickness deposited on the sidewalls of the gate patterns is large. This deposit is followed by highly anisotropic etching, which preferentially attacks the horizontal surfaces, in other words those parallel to the plane of substrate 110, thus leaving the deposit only on the perpendicular surfaces covering the sidewalls of the gate patterns. The spacers are therefore obtained without photolithography operation and in this way become self-aligned on the gates.

FIG. 3c shows the structure of the transistor at the end of step 240 of the method, at which time ion implantation 131 is performed on surface layer 116 of monocrystalline silicon in order to invert the doping thereof. In the case of the production of transistors referred to as N MOSFET, in other words with P channel or of intrinsic type, implantation is performed with dopants of type N, for example arsenic (As) or phosphorus (P). In the contrary case of transistors referred to as P MOSFET, in other words with N channel or of intrinsic type, implantation is performed with boron (B) or boron fluoride ($BF_2$), for example. The implantation operation is performed over the entire surface. The channel of the transistors is protected from implantation by the gate and the spacers. The gate itself is protected from implantation by hard mask 126 and spacers 130. The doping 117 of surface layer 116 defines the zones of extent of source and drain, which therefore become self-aligned on the gate. This operation defines the length 182 of channel 180 in the active layer, in other words the surface layer 116 of monocrystalline silicon of layer stack 112, 114, 116, in other words the starting SOI substrate in this particular example.

It will be noted here that it is common practice to form complementary transistors on the same SOI wafer, in such a way as to produce, for example, logic circuits of the type referred to as "CMOS", the English acronym for "complementary metal oxide semiconductor", in other words complementary P-channel and N-channel FET transistors of MOS structure. The standard method described hereinabove and the method of the invention described hereinafter are adapted simply by forming the two types of transistors successively and by repeating the operations specific to the two types of transistors over the non-masked zones obtained previously by photolithography.

FIGS. 4a to 4e describe the steps of the method that are specific to the invention. The method of the invention differs notably from the standard method by not undertaking a raising of the S/D zones and therefore not performing the corresponding step of epitaxial growth, in other words step 250 described in the prior art. As will be seen, to solve the problem of decreasing the access resistances of the S/Ds, the method of the invention is arranged so as to increase the thickness of these zones under surface layer 116 in which the channel of the transistors is formed, thus making it possible to increase this thickness in order to decrease its resistance without increasing the parasitic gate-S/D capacitance at the same time.

Figure 4A:
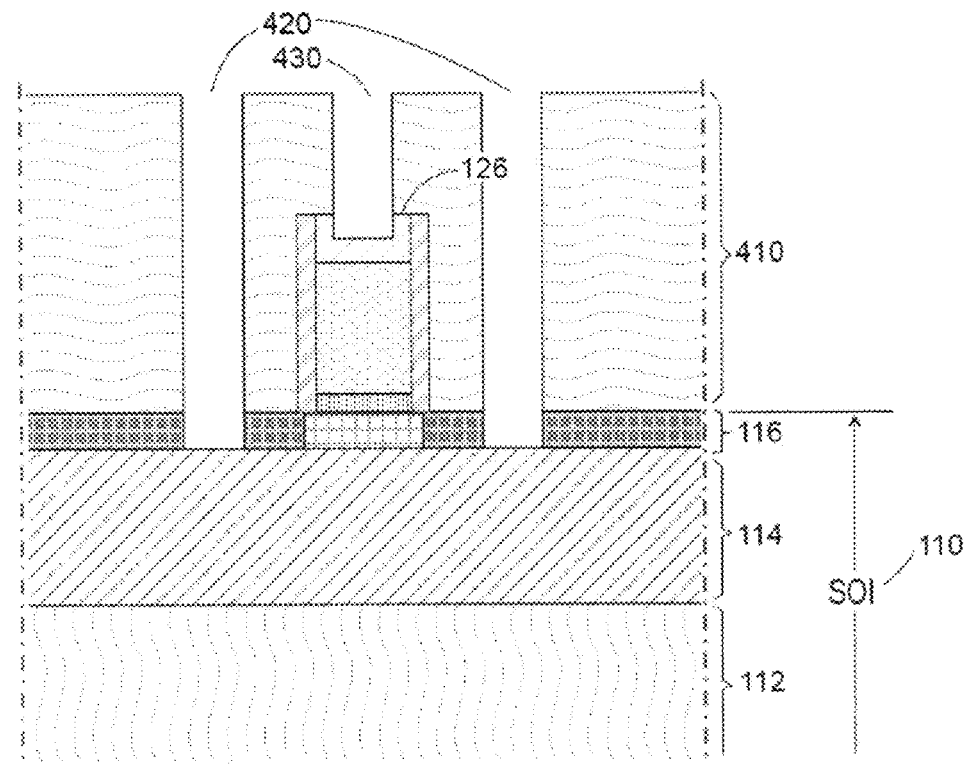
FIGS. 4a to 4e illustrate the steps specific to the invention in the method for fabrication of MOSFET transistors, FIG. 4e illustrating an example of a transistor according to the invention once it has been finalized.

FIG. 4a describes the operation of formation of contacts on the electrodes of the transistor. It is performed by depositing a layer 410 of a material resistant to hydrofluoric acid (HF), an acid that will then be used to etch the silicon oxide of buried layer 114. An example of a material that meets this need is carbon-doped silicon oxide (SiOCH) or amorphous carbon, especially in the form of commercially available products known by the acronym "APF", for the English "advanced patterning film". It is possible, for example, to deposit these materials by centrifugation or by plasma-assisted chemical vapor-phase deposition, a technique usually referred to by the acronym PECVD, for the English phrase "plasma enhanced chemical vapor deposition".

Contact patterns 420 for the source and the drain and 430 for the gate are defined by lithography and then etched in layer 410, which as just seen is made of carbon-doped silicon oxide (SiOCH) or of amorphous carbon (APF). The etching of layer 410 is stopped on the one hand at the tops of the gates, on hard mask 126, generally made of silicon nitride, and on the other hand in the S/D zones, down to the silicon of the layer active layer 116. This etching and the etching products used are based on fluorocarbon chemistry for SiOCH, with reaction products such as CO, SiF, $CF_x$ and HF. For amorphous carbon (APF), it is hydrogen-based chemistry ($N_2/H_2$, $NH_3$) that is used, for example with products such as $CH_x$ and CN.

The silicon of active layer 116 is then etched with stopping on oxide layer 114 buried in the S/D zones and, at the tops of the gates, on hard mask layer 126, with partial consumption of this layer, as illustrated. The etching is of the dry etching type, with chlorine-base chemistry, for example (HBr/Cl2) or fluorocarbon chemistry (CF4).

Figure 4B:
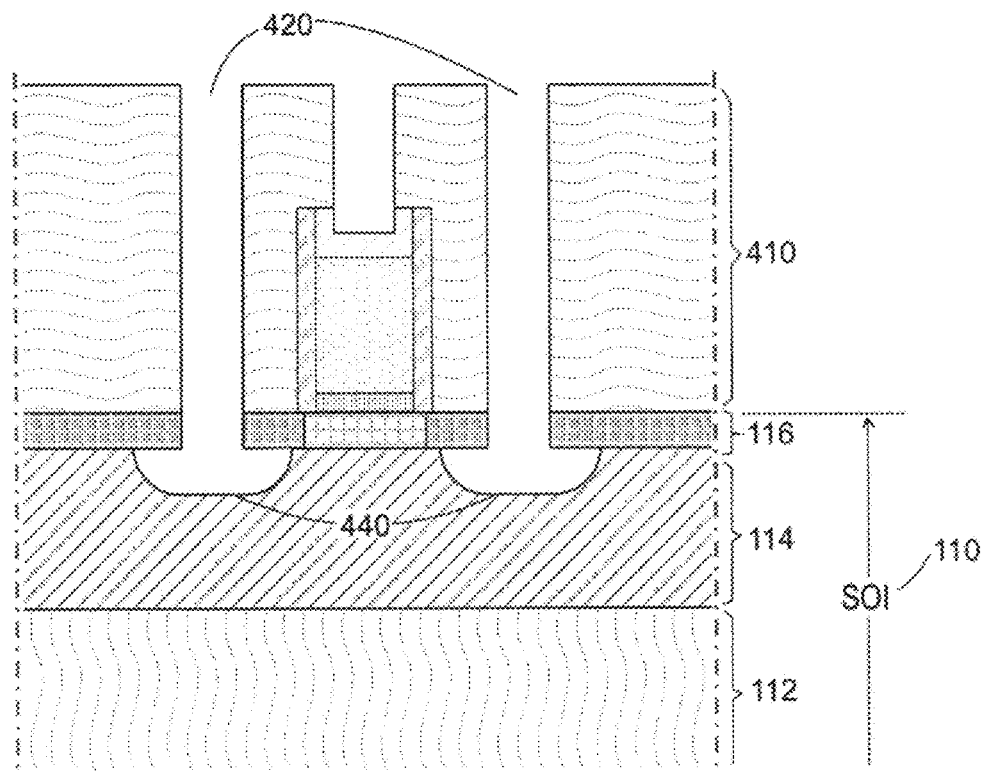

FIG. 4b shows the formation of cavities 440 in buried layer 114 of silicon oxide originating from the starting SOI substrate, at the bottom of S/D contacts 420 that have just been etched through protective layer 410 and active layer 116. Cavities 440 are formed by wet etching using a solution based on hydrofluoric acid (HF) or with dry chemistry based on HF, for example STI from anhydrous HF in a gas bottle using hot N2 as carrier gas. The hydrofluoric acid concentration of the solution and the etching time are adjusted as a function of the consumption of silicon oxide necessary to obtain the desired dimension of the cavities.

These cavities extend in part at least underneath active layer 116.

Preferably, the etching is selective for SiOCH or APF and for Si, so that layers 410 and 116 retain constant shape.

Preferably, the step of formation of a cavity in the insulating layer is achieved so as to form a cavity having a depth, in a direction perpendicular to the plane of the substrate, which is a depth taken from the lower face of the insulating layer overlaid by the active layer, of between 1 nm and Tbox-2 nm, Tbox being the thickness of insulating layer 114. Preferably, therefore, S/Ds 140 do not pass through insulating layer 114. They do not pass through the entire thickness of insulating layer 114. The bottom of the cavity is therefore situated in the insulating layer, as is clearly apparent in the figures. In this way the invention makes it possible to preserve electrical insulation between S/Ds 140 and substrate 112. Preferably, it will be ensured that the part of the source and drain that extends isotropically underneath the spacers does not extend beyond spacers 130, in other words that cavities 440 are not present in the vertical extension of spacers 130. In fact, the depth is defined by etching that may be isotropic. In this case, a relationship exists between width and height. The two limiting conditions are therefore: height smaller than Tbox-2 nm and width such that the SDs do not extend underneath the gate beyond the spacers.

The lateral extremity of the sources and drain is therefore set back relative to the vertical extension of the spacers. A distance l1 taken in a direction along a direction perpendicular to the sidewalls of the gate (and therefore along the horizontal in the figures) represented in FIG. 4c may therefore be defined between the external face of a spacer 130 and the source or drain closest to it.

Similarly, the source and drain are set back relative to the sidewalls of gate 120. A distance l2 taken along a direction perpendicular to the sidewalls of the gate (and therefore along the horizontal in the figures) represented in FIG. 4c may therefore be defined between the sidewall of gate 120 and the source or drain closest to it.

Figure 5A:
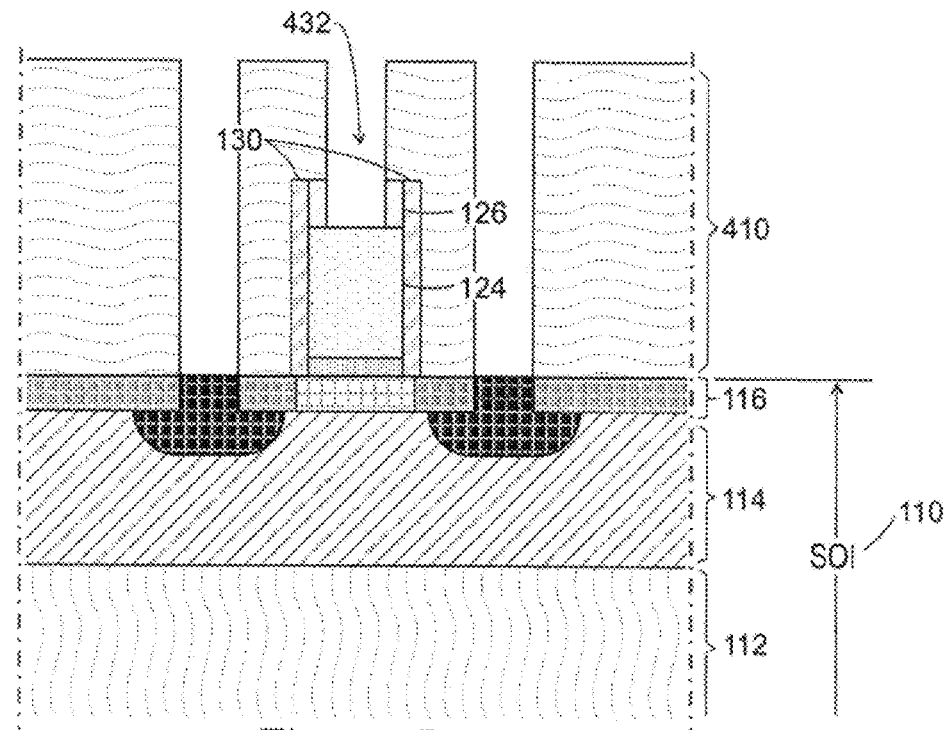
FIGS. 5a and 5b describe alternative embodiments of the method of the invention, FIG. 5b illustrating an example of a transistor according to the invention once it has been finalized.
Figure 5B:
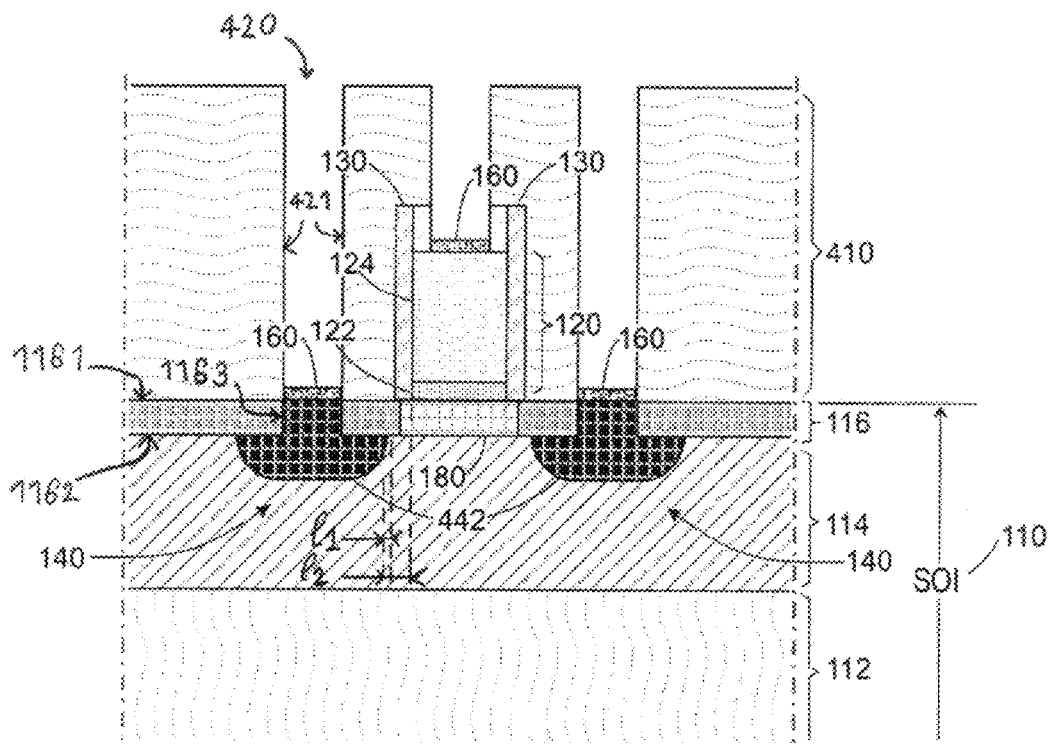

The distances l1 and l2 are also represented in FIG. 5b.

The height of the sources and drain is preferably equal to the thickness of active layer 116 plus the depth of cavity 440 taken from the lower face of active layer 116.

Figure 4C:
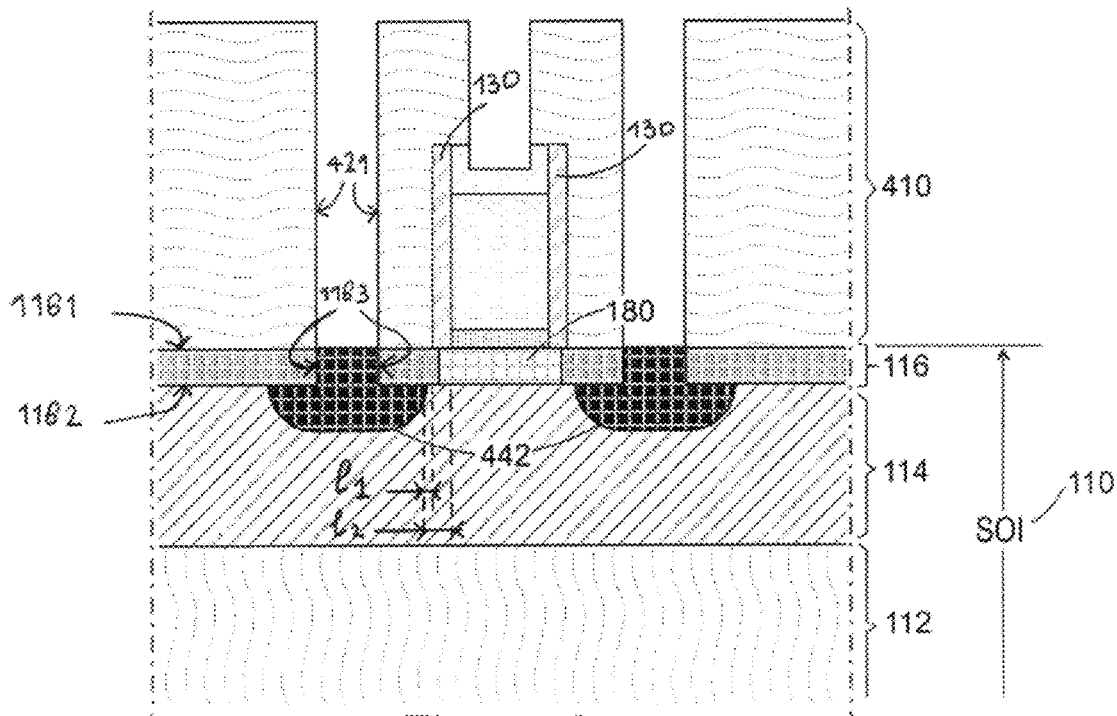

FIG. 4c shows the result of the epitaxial growth that subsequently takes place in cavities 440 starting from active layer 116, typically made of monocrystalline silicon. In this exemplary embodiment, therefore, the cavity-filling material, which forms inverted S/Ds 442, is silicon, which is preferably doped in situ at the same time as the epitaxial growth is taking place. The type of doping depends on the type of transistors being fabricated, with N or P channel, and corresponds to the doping of the corresponding S/D zones, respectively P or N. It is noted that the raised S/Ds of the standard method are inverted here and replaced by epitaxial growth at and underneath active layer 116 of channel 180. The depth and dimensions of the cavities may therefore be adjusted to obtain a small access resistance of the S/Ds without increasing the parasitic capacitance between gate and S/D. It will be noted here that the position of the cavities will be all the better controlled the more the opening of the S/D contacts is self-aligned on the gate.

In this way the invention makes it possible to form a source and a drain underneath the gate. Since the source and the drain are buried in insulating layer 114, the gate will no longer have any surface or will have only a small surface facing the source and the drain in a direction parallel to the plane of substrate 112, thus decreasing the parasitic capacitance. In addition, it is perfectly possible to form a source and a drain of large thickness so as to reduce the resistance. The formation of the source and of the drain depends on relatively simple steps that can be reproduced reliably and easily.

Thus it is clearly apparent that the walls of patterns 420 limit the growth of sources and drains 442 in a direction substantially parallel to the plane of substrate 112, in other words in a horizontal direction in the figures. In fact, walls 421 of patterns 420 remain in place during the growth of S/Ds 140. As illustrated, S/Ds 140 therefore do not extend over upper face 1161 of active layer 116. They do not cover the latter. Upper face 1161 of active layer 116 is not covered by S/Ds 140. S/Ds 140 are in contact only with insulating layer 114 as well as lower face 1162 of active layer 116 and transverse walls 1163 of active layer 116 that define the thickness of the latter. Transverse walls 1163 therefore extend in a plane perpendicular to the plane of substrate 112 and in a vertical plane relative to FIGS. 4a to 5b (in a plane parallel to the sidewalls of gate 120). Particularly advantageously, the absence of material forming the S/Ds covering active layer 116 makes it possible to reduce the parasitic capacitance.

The formation of cavities 440 is then carried out in such a way as to etch both lower face 1162 and vertical walls 1163 of active layer 116 as well as insulating layer 114, preferably over only part of its thickness.

As illustrated in FIGS. 4c to 5b, the cavities are completely filled during filling. Thus, and as represented in the figures, for their part situated underneath lower face 1162 of active layer 116, source and drain 140 are in contact over their entire surface area with insulating layer 114.

If the foregoing epitaxy is not doped, the doping of the inverted S/D zones is then carried out, for example, by ion implantation. As mentioned in the foregoing, in the case of formation of complementary P and N channel transistors, the two types of transistors are formed successively by using photolithography to mask the zones of transistors of opposite type. The doping of inverted S/D zones by implantation then requires that diffusion annealing of the dopants be performed. This operation is also advantageous in the case in which the doping is carried out in situ during the inverted epitaxial growth.

Figure 4D:
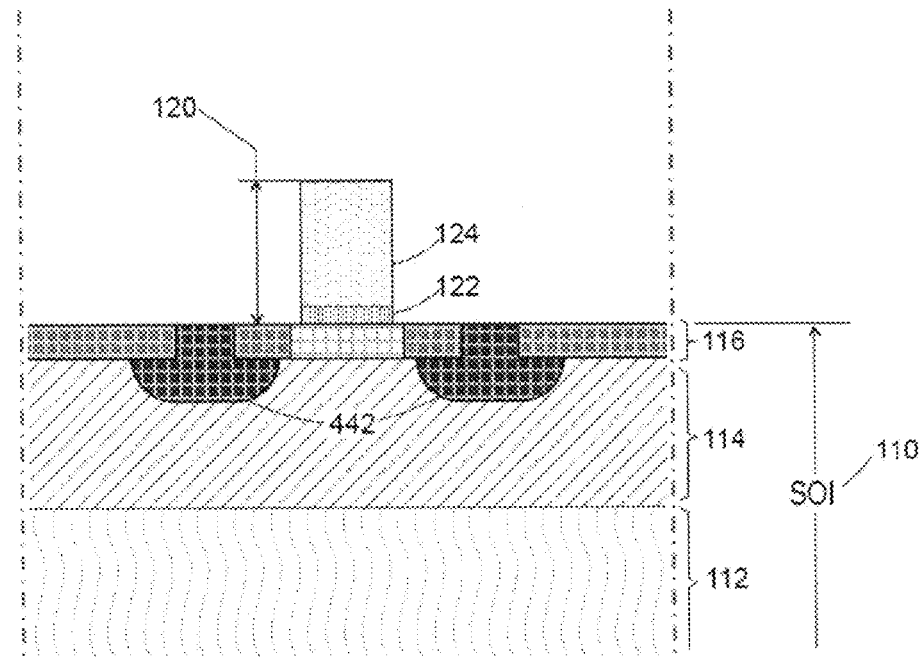

FIG. 4d describes the step of the method of the invention in which protective layer 410 made of carbon-doped silicon oxide (SiOCH) or of amorphous carbon (APF) is removed. It will therefore be noted that protective layer 410 is advantageously preserved during the step of filling of the cavities, as is apparent in FIG. 4c, thus making it possible to limit the extent of source and drain zones 140 above active layer 116 which makes it possible to limit the parasitic capacitances even more.

In the case of SiOCH, protective layer 410 is removed by plasma etching and more particularly by means of a technique referred to as "delocalized plasma", in which the plasma is formed in a chamber separated from that in which etching is performed, in order to make it possible to eliminate certain of the generated particles so that they do not damage the surface of the wafer. The objective of plasma etching in this case is to transform the carbon-doped silicon oxide (SiOCH) to silicon oxide ($SiO_2$), which is then selectively removed by means of a solution based on hydrofluoric acid (HF). In the case of APF, stripping is also achieved by means of an oxygen-base plasma.

The nitride of the spacers and hard mask 126, generally made of nitride, are also removed by means of wet cleaning, most often referred to by the English phrase "wet clean".

After these operations, gate 120 is left only with the two layers essential to the functioning of the device: gate oxide 122 and gate control electrode 124 made of polycrystalline silicon. Inverted source and drain 442 that were formed in the cavities of the buried oxide layer are present on both sides of the gate.

Figure 4E:
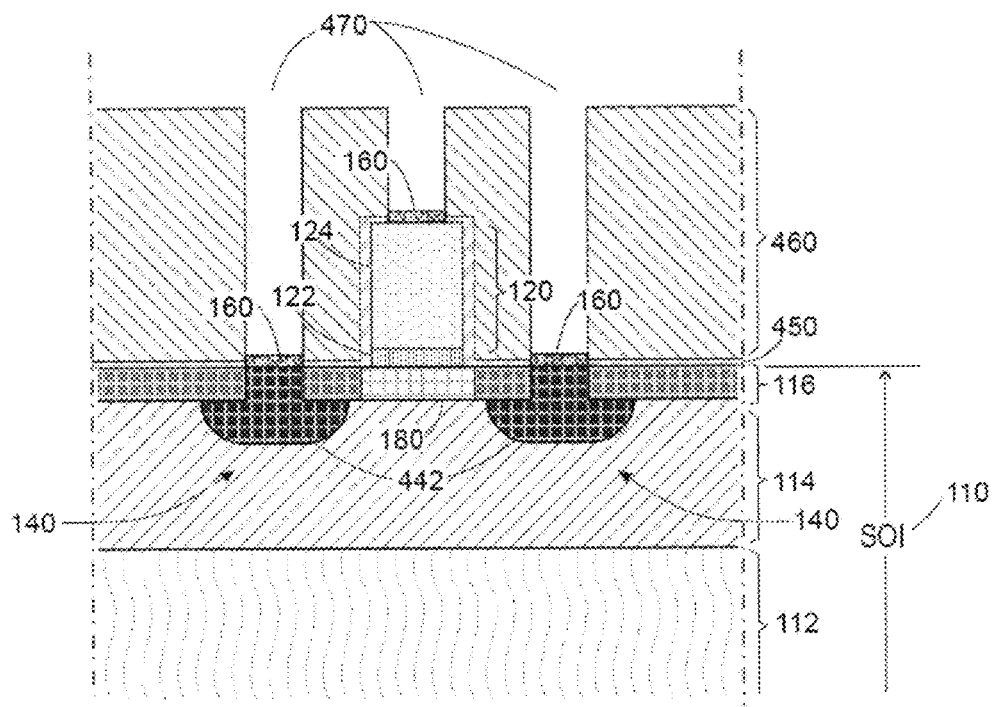

FIG. 4e describes the step of formation of contacts on the electrodes of the transistor. This step may be achieved by techniques known to the person skilled in the art. In the course of this step, firstly a stop layer 450, typically made of silicon nitride then a protective layer 460, preferably of silicon oxide, are preferably deposited. The layer of silicon nitride functions as a stop layer during the etching of silicon oxide 460. However, this layer is optional and functions only to limit the consumption of Si during the step of etching of the $SiO_2$, since the selectivity of SiN/Si is better than that of SiO2/Si. It is in these insulating layers of the transistors that the contacts of the gate and of the source and drain will be opened 470 once again after planarization of the surface has been performed to ensure that the numerous metal layers (not represented) necessary for interconnection of the transistors remain as plane as possible. The planarization operation consists, for example, of polishing the wafer by a technique of the CMP type, the English acronym for "chemical mechanical polishing", in other words "mechanochemical polishing". After the contact zones have been defined by photolithography, they are then etched through oxide layer 460 and nitride layer 450 as far as the polycrystalline silicon of gate 124 and as far as the silicon of inverted S/Ds 442. As in the standard method, it is then possible to perform silicidation 160 of the contact zones in order to assure good electrical contact with the underlying silicon.

It will be noted that, in this embodiment of the invention, it is also possible to perform silicidation of the contacts before carbon-doped silicon oxide layer (SiOCH) 410 is stripped. In this case, the etching of the contacts will be stopped at a silicon silicide, which may have better etching selectivity than silicon, and hard mask 126, generally made of silicon nitride, situated at the top of the gate will be stripped beforehand, as in the step corresponding to FIG. 5a described hereinafter.

FIGS. 5a and 5b describe another alternative embodiment of the method of the invention.

FIG. 5a shows the case in which, after the step corresponding to FIG. 4c, in other words the step of epitaxial growth to fill the cavities, carbon-doped silicon oxide layer (SiOCH) 410, which replaces the silicon oxide ($SiO_2$) traditionally used to make the contacts, is preserved. In this way there is no need for the step corresponding to FIG. 4d, in which the SiOCH is removed and the steps of deposition of a nitride layer 450 and of silicon oxide layer 460 are carried out, which steps are followed by re-opening 470 of the contacts, as shown in FIG. 4e. It will be noted that nitride spacers 130 then remain in place. In this alternative embodiment of the invention, the inverted epitaxy in cavities 440 is preferably doped in situ. In fact, since access does not exist to the zones of silicon close to the spacers, which are covered by the SiOCH that is left in place, it is therefore not possible to implant dopants close to these spacers. On the other hand, they can be diffused from the epitaxy doped in situ which is close to the borders of the spacers.

In the step corresponding to FIG. 5a, what takes place is therefore essentially opening 432 of the gate contacts by dry or wet etching of the remaining layer of hard mask 126 situated on top of the gates, thus permitting access to the polycrystalline silicon of control gate 124.

As shown in FIG. 5*b*, it may then be possible to proceed with silicidation 160 of all of the contact zones, as in the foregoing.

The advantage of preserving protective layer 410 or 460 when the final structure is obtained is that, in this case, the contact holes have already been made. With the conventional methods, this step of forming contacts necessitates control of the etching that becomes stopped at the silicide. By preserving layers 460 and 410, the invention makes it possible to relax the constraints on the formation of the contacts.

Figure 6:
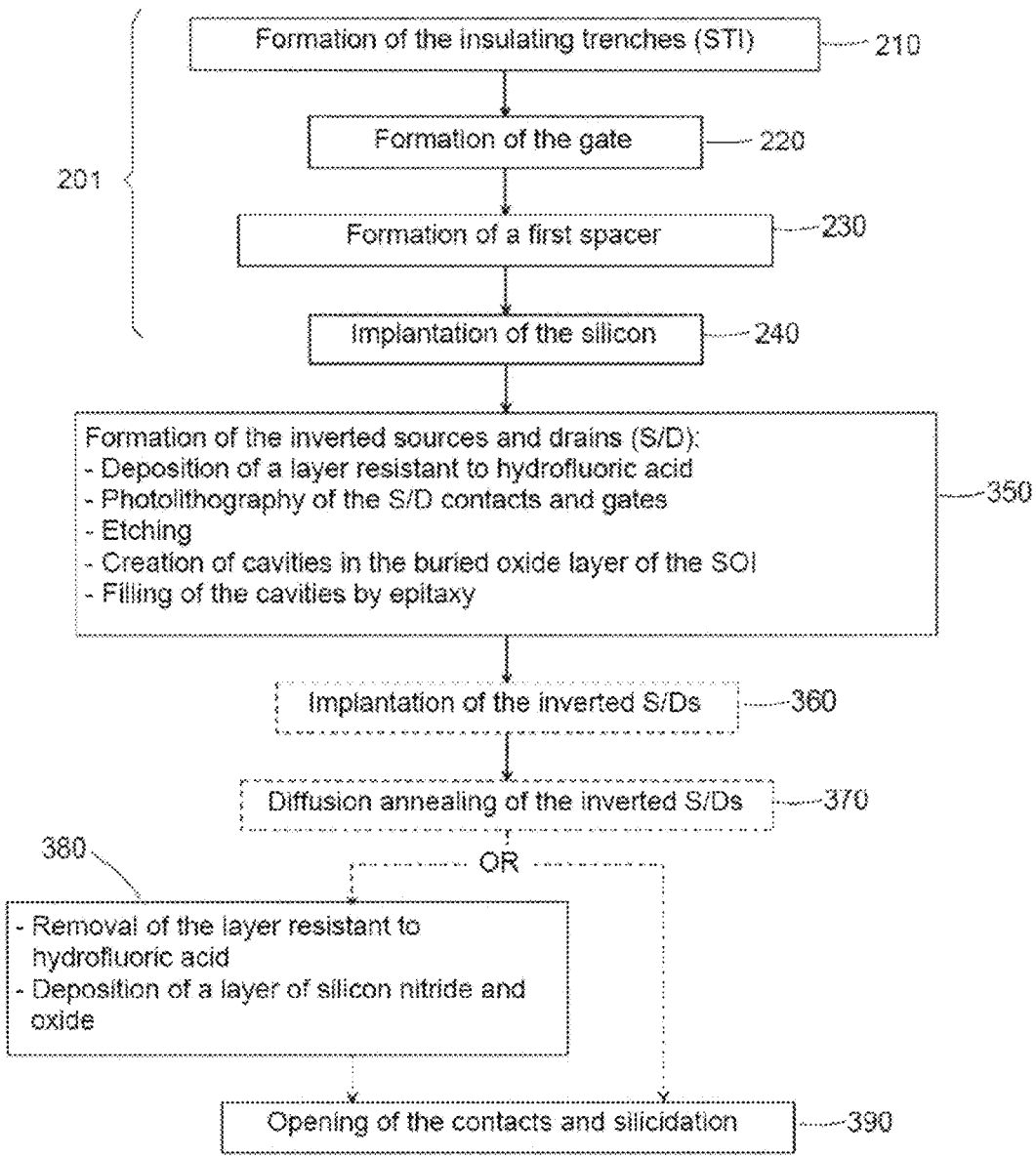
FIG. 6 summarizes the main steps of fabrication of a MOSFET transistor according to the method of the invention.

FIG. 6 summarizes the main steps of fabrication of a transistor according to the method of the invention.

Preliminary steps 201 up to implantation of surface layer 116 of silicon are the same as those of the standard method. They are steps 210, 220, 230 and 240, which were described in FIGS. 3*a* to 3*c*. The method of the invention relates to steps 350, 360, 370, 380 and 390.

As was seen in FIGS. 4*a* to 4*e*, step 350 consists of creating the inverted S/Ds and making them grow by epitaxy in the cavities previously excavated in the insulating layer, typically the buried oxide layer of a starting SOI substrate. The creation of cavities requires that a gate-protecting layer, resistant to hydrofluoric acid (HF), be deposited, so that, after etching of the contact patterns, cavities can be formed. The epitaxial silicon is preferably doped in situ during the growth of the inverted S/Ds.

Step 360 of implantation of the inverted S/Ds is optional. It is advantageous if the doping in situ during the epitaxial growth has not been performed. Since the implantation induces defects that may be more difficult to cure in a thin film than in massive silicon, and the thickness of the undamaged monocrystalline nucleus may then be small or even zero and may be a function of the embodiments of the invention, the doping in situ may be preferred to implantation.

An optional step 370 of diffusion annealing of the dopants that may have been implanted in the preceding step is then performed. The annealing may also be applied in the case in which the doping was performed in situ during the epitaxial growth. It will be noted here that, a variant of the fabrication method consists in that annealing step 370 also functions to control the extent of the S/D zones that will define the length of the channel of the transistor underneath the gate. This operation may then replace standard step 240 of implantation of the silicon described in the foregoing, thus simplifying the fabrication method of the invention.

The following step 380 relates to the variant of the method described in FIGS. 4*a* to 4*e*, where layer 410 resistant to hydrofluoric acid is removed to be replaced by an insulating layer 460 made of silicon oxide, in which contacts will be opened and silicidated in step 390.

As explained in FIGS. 5*a* and 5*b*, the layer resistant to hydrofluoric acid may also be left in place and utilized functionally. This is possible in particular if the layer is made of carbon-doped silicon oxide (SiOCH). In this case, step 350 and possibly optional steps 360 and 370, are followed directly by step 390, in which contacts 432 that have not yet been opened, in other words those of the gate, are now opened and all contacts are silicidated.

Figure 1:
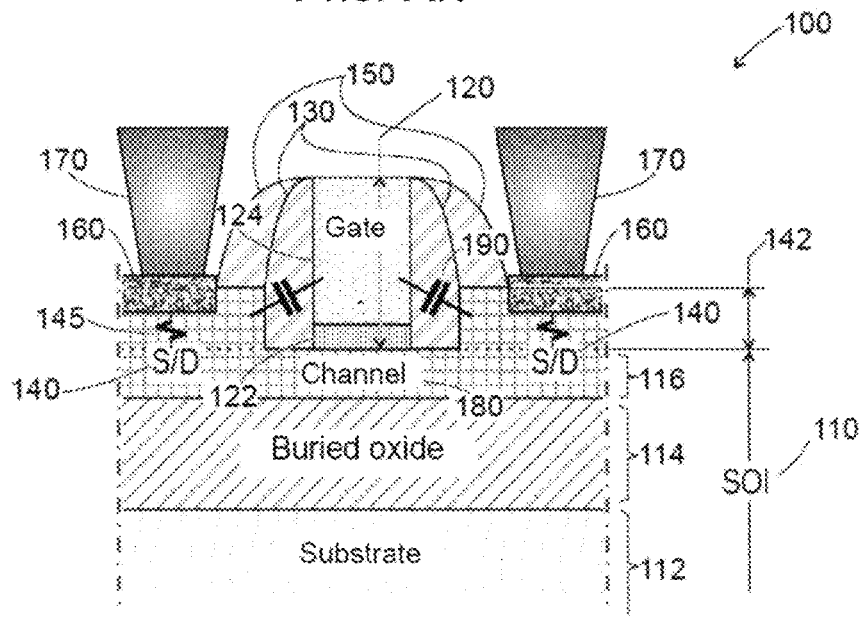
FIG. 1 shows a cross-sectional view of a MOSFET transistor characteristic of the prior art.
Figure 2:
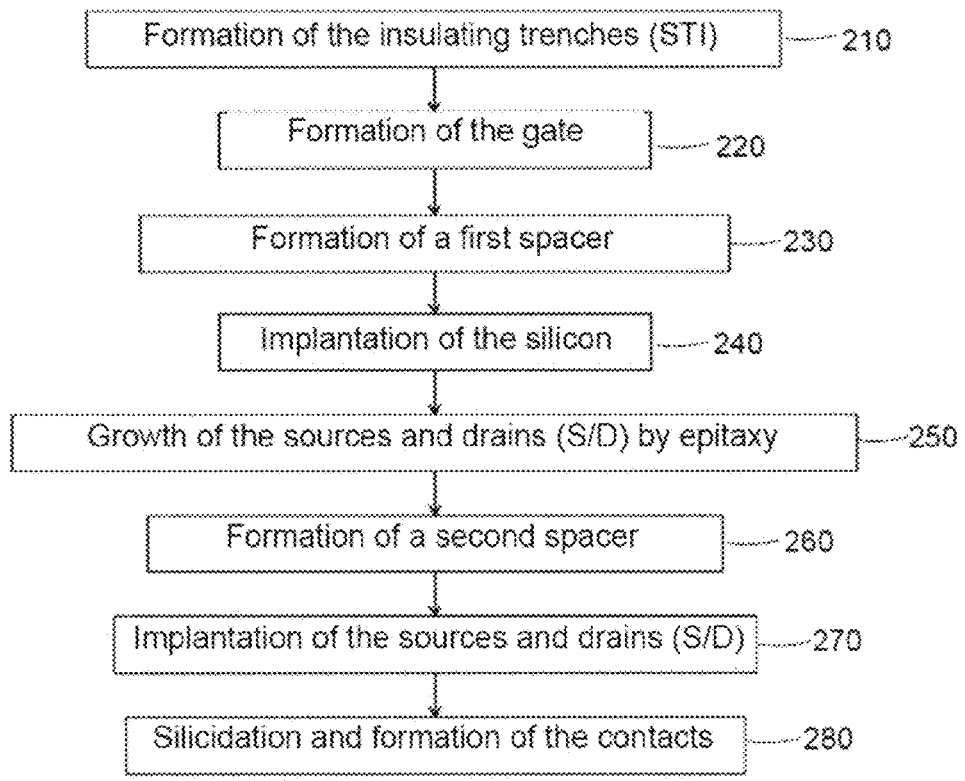
FIG. 2 summarizes the main standard steps of fabrication of a MOSFET transistor representative of the prior art.

Finally, it will be noted that, among the advantages of the method of the invention, the gate height is no longer dependent on height 140 of the raised S/Ds of the standard method. In fact, as illustrated in FIG. 1, it is generally required that the gate contact must be situated higher than the S/D contacts, thus necessitating a large gate height 120 and proportionally increases parasitic gate-S/D capacitance 190. This height 120 comprises the height of gate 124 and of gate oxide 122. In contrast, with the method of the invention, since the S/Ds are situated underneath the level of the channel, in buried oxide 114, the gate height may be freely adjusted independently of the height of the raised S/Ds. That facilitates not only employment of the standard method used most commonly by the microelectronics industry, the one described in the foregoing where the gate is formed first ("gate first" in the technical English literature on the subject), but also the use of less common methods, such as that in which the gate is formed last ("gate last"), typically after the steps of formation of the sources and drains. In this case, the gate contact is obtained by a technique known as damasking necessitating polishing of CMP type. Thus the present invention advantageously makes it possible to form the gate last, which avoids subjecting the gate to thermal stresses, for example, and to stresses related to the fabrication of the other elements of the transistor, which consequently makes it possible to preserve the heat budget of the gate.

It will also be noted that the method of the invention does not specifically require the use of spacers for the source and drain. The contact may therefore be closer to the gate. In this way the silicidation used by the standard method may be dispensed with and replaced by silicidation of the bottom of the contact. The elimination of SD spacers permits a reduction of the repeat spacing of the gates and therefore makes it possible to achieve a corresponding increase of density.

The invention is not limited to the embodiments described in the forgoing, but extends to any embodiment in conformity with its spirit. In particular, the invention also extends to stacks of layers not formed by a substrate of SOI type.

The invention claimed is:

1. A method of fabrication of a transistor, comprising:
preparing a stack of layers provided with at least one substrate overlaid by an insulating layer and by an active layer, a first portion of the active layer being configured to form a channel for the transistor, and a second portion of the active layer and a third portion of the active layer being separated from each other and from the first portion; and
preparing a source and a drain, wherein said preparing comprises:
depositing a protective layer covering at least the active layer,
forming openings through the protective layer and the active layer to expose the insulating layer at zones intended to form the source and the drain, the protective layer forming at least a first two walls above one of the zones intended to form the source and at least a second two walls above another of the zones intended to form the drain;
forming cavities in the insulating layer at a bottom of the openings, the cavities extending under the at least the first two walls and extending under the at least the second two walls; and
filling the cavities by a semiconductor material, the protective layer being preserved during the filling of the cavities,
wherein the source and the drain do not extend over an upper face of the first portion of the active layer, the second portion of the active layer, and the third portion of the active layer, and
wherein the source contacts at least two first side surfaces and at least two first bottom surfaces of the active layer, and the drain contacts at least two second side surfaces and at least two second bottom surfaces of the active layer.

2. The method according to claim 1, wherein the forming of the cavities in the insulating layer is performed so that a depth of said cavities in a direction perpendicular to a plane of the at least one substrate is between one nanometer and a thickness equal to another thickness of the insulating layer less two nanometers, the another thickness being taken from a lower face of the active layer and in a direction perpendicular to the plane of the at least one substrate.

3. The method according to claim 2, wherein the active layer is made of the semiconductor material and the filling of the cavities is achieved by epitaxy of the active layer.

4. The method according to claim 3, wherein the forming of the cavities takes place in such a way that each bottom of the cavities is situated in the insulating layer and such that lateral extremities of the cavities are distant from a vertical extension of sidewalls of a gate.

5. The method according to claim 4, wherein silicidation of contacts is performed at the source and the drain.

6. The method according to claim 1, wherein the protective layer is preserved in the course of all of the steps after the depositing the protective layer.

7. The method according to claim 1, additionally comprising, after the filling of the cavities by the semiconductor material:
removing the protective layer;
depositing at least one electrically insulating layer;
opening contact zones at least at the source and the drain through said least one electrically insulating layer.

8. The method according to claim 1, wherein the source and the drain are doped either in situ during the filling of the cavities, or by ion implantation after the filling of the cavities.

9. The method according to claim 1, wherein the source and the drain are subjected to diffusion annealing.

10. The method according to claim 1, wherein the stack of layers comprising the at least one substrate, the insulating layer, and the active layer is a substrate of semiconductor on insulator type.

11. The method according to claim 1, wherein the material constituting the protective layer is carbon-doped silicon oxide (SiOCH) or is amorphous carbon (APF).

12. The method according to claim 1, wherein the preparing the source and the drain is performed after forming a control gate of the transistor or before forming a control gate of the transistor, the control gate being formed such that it is overlying the active layer.

13. A transistor, comprising:
an active layer, a first portion of the active layer forming a channel for the transistor, and a second portion of the active layer and a third portion of the active layer being separated from each other and from the first portion;
an insulating layer disposed facing a lower face of the active layer;
a gate facing an upper face of the active layer;
a protective layer covering the active layer and the gate;
openings that extend through the protective layer and through the active layer, said openings in the protective layer being aligned with said openings in the active layer; and
a source and a drain disposed on both sides of the gate,
wherein at least one among the source and the drain extends at least partly through the openings in the active layer and into cavities of the insulating layer disposed at least partly under the openings, in such a way as to fill the cavities entirely,
wherein the protective layer includes at least a first two walls above the source and at least a second two walls above the drain,
wherein the cavities extend under the at least the first two walls and extend under the at least the second two walls,
wherein the source and the drain do not extend over the upper face of the first portion of the active layer, the second portion of the active layer, and the third portion of the active layer, and
wherein the source contacts at least two first side surfaces and at least two first bottom surfaces of the active layer, and the drain contacts at least two second side surfaces and at least two second bottom surfaces of the active layer.

14. The transistor according to claim 13, wherein the at least one among the source and the drain has a thickness of between 1 nanometer and a thickness equal to another thickness of the insulating layer less two nanometers, the another thickness being taken in a direction perpendicular to a plane of a substrate on which the active layer and the insulating layer are disposed.

15. The transistor according to claim 14, wherein an upper face of the at least one among the source and the drain, taken in a direction parallel to the plane of the substrate, is disposed entirely underneath a lower face of the gate.

* * * * *